(12) United States Patent
Mehrad et al.

(10) Patent No.: US 6,348,370 B1
(45) Date of Patent: Feb. 19, 2002

(54) METHOD TO FABRICATE A SELF ALIGNED SOURCE RESISTOR IN EMBEDDED FLASH MEMORY APPLICATIONS

(75) Inventors: Freidoon Mehrad, Plano; Harold D. Goodpaster, Richardson; Anand Seshadri, Plano, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/610,274

(22) Filed: Jul. 6, 2000

(51) Int. Cl.[7] .......................... H01L 21/8234
(52) U.S. Cl. .................. 438/210; 438/238; 438/232
(58) Field of Search .................... 438/238, 221, 438/257, 210, 229, 232, 524, FOR 212, FOR 220

(56) References Cited

U.S. PATENT DOCUMENTS

| 6,080,625 A | * | 6/2000 | Chittipeddi et al. |
| 6,090,648 A | * | 7/2000 | Reedy et al. |
| 6,218,265 B1 | * | 4/2001 | Colpani |

FOREIGN PATENT DOCUMENTS

EP 0 545 363 A1 * 6/1993

* cited by examiner

*Primary Examiner*—George Fourson
*Assistant Examiner*—Thanh Pham
(74) *Attorney, Agent, or Firm*—Peter K. McLarty; W. James Brady, III; Frederick J. Telecky, Jr.

(57) ABSTRACT

A method for fabricating a semiconductor resistor in embedded FLASH memory applications is described. In the method a gate array (9) is formed on a semiconductor substrate. Isolations regions (70) are removed and the exposed silicon implanted forming diffused regions (180). The SAS so formed can be configured to function as a resistor element (240).

5 Claims, 4 Drawing Sheets

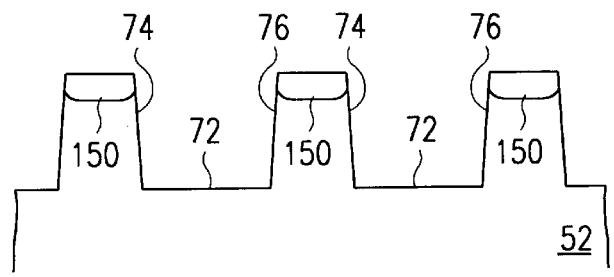
FIG. 7A
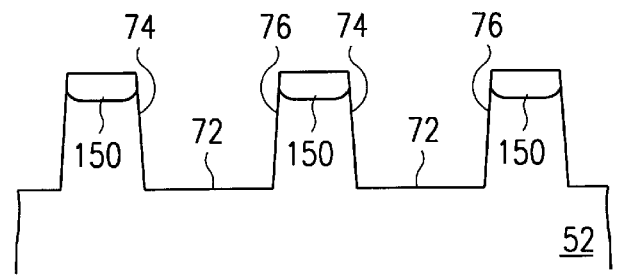
FIG. 7B
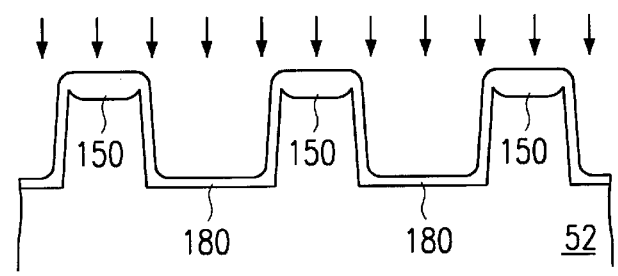
FIG. 8A
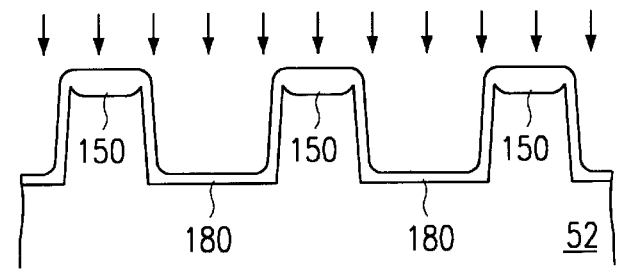
FIG. 8B
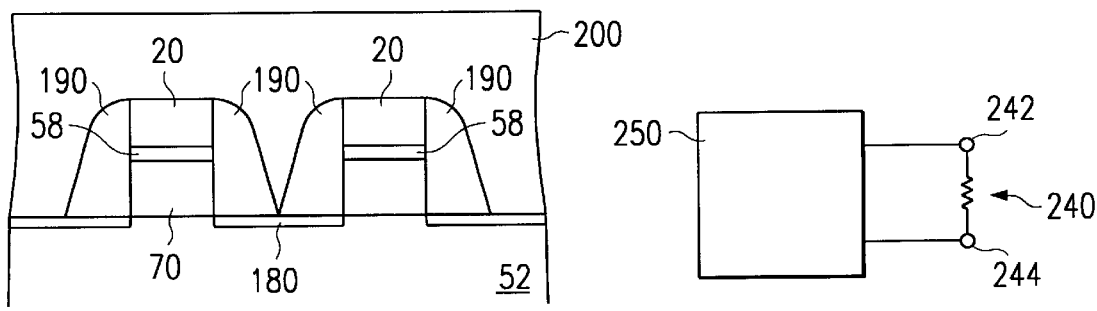
FIG. 9
FIG. 10

METHOD TO FABRICATE A SELF ALIGNED SOURCE RESISTOR IN EMBEDDED FLASH MEMORY APPLICATIONS

CROSS-REFERENCE TO RELATED PATENT/PATENT APPLICATIONS

The following commonly assigned patent/patent applications are hereby incorporated herein by reference:

| Patent No./Serial No. | Filing Date | TI Case No. |
| --- | --- | --- |
| 60/068,543 | 12/23/97 | TI-23167 |
| 60/117,774 | 1/29/99 | TI-28594 |
| * | * | TI- |

FIELD OF THE INVENTION

This invention relates generally to the field of electronic devices and more particularly to a method for forming a general purpose self aligned source resistor in embedded flash memory applications

BACKGROUND OF THE INVENTION

Electronic equipment such as televisions, telephones, radios, and computers are often constructed using semiconductor components, such as integrated circuits, memory chips, and the like. The semiconductor components are typically constructed from various microelectronic devices fabricated on a semiconductor substrate, such as transistors, capacitors, diodes, resistors, and the like. Each microelectronic device is typically a pattern of conductor, semiconductor, and insulator regions formed on the semiconductor substrate.

The density of the microelectronic devices on the semiconductor substrate may be increased by decreasing spacing between each of the various semiconductor devices. The decrease in spacing allows a larger number of such microelectronic devices to be formed on the semiconductor substrate. As a result, the computing power and speed of the semiconductor component may be greatly improved.

FLASH memory, also known as FLASH EPROM or FLASH EEPROM, is a semiconductor component that is formed from an array of memory cells with each cell having a floating gate transistor. Data can be written to each cell within the array, but the data is erased in blocks of cells. Each cell is a floating gate transistor having a source, drain, floating gate, and a control gate. The floating gate uses channel hot electrons for writing from the drain and uses Fowler-Nordheim tunneling for erasure from the source. The sources of each floating gate in each cell in a row of the array are connected to form a source line.

Embedding FLASH memory circuits in CMOS logic circuits is finding increasing usage in building more complex integrated circuits such as digital signal processors for applications such as hard disk controllers. In addition to CMOS transistors and FLASH memory cells, it is necessary to have other components such as resistors as a part of the integrated circuits. These resistors are usually formed using polycyrstalline silicon which is commonly used to form the gate electrode. This polycrystalline (poly) resistor can be formed during the gate poly process where it is defined at the gate level and protected from silicidation by using an extra mask to prevent the sidewall dry etch from etching the nitride from the top of the resistor. Since the use of this extra mask is not desirable, attempts are being made to eliminate this mask. In applications where FLASH memory is used, this mask can be eliminated by using the poly-1 layer in the floating gate transistor to form the resistor. The sheet resistance of the poly-1 film is typically about 1500–2500 ohm/sq. For high frequency applications however, the capacitances associated with the poly-1 resistor and the floating/control gate structure make the resistance frequency dependent and therefore not suitable for use. The instant invention addresses this problem and describes a method for fabricating a general purpose self aligned source resistor in embedded FLASH applications.

SUMMARY OF THE INVENTION

The instant invention provides a method of forming a resistor in an integrated circuit containing FLASH memory cells. The method comprises: A method for forming a resistor in a semiconductor substrate comprising: providing a region of a first conductivity type in said semiconductor substrate; providing on said region of a first conductivity type, a plurality of substantially parallel wordlines that cross a plurality of substantially parallel isolation regions, said isolation regions containing an isolation material; implanting said region of a first conductivity type in said semiconductor substrate containing said plurality of substantially parallel wordlines and said plurality of substantially parallel isolation regions with a first species; etching said isolation material from all regions of said plurality of substantially parallel isolation regions not covered by said plurality of substantially parallel wordlines; and implanting said region of a first conductivity type in said semiconductor substrate containing said plurality of substantially parallel wordlines and said plurality of substantially parallel isolation regions with said first species to form a resistor.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which:

FIGS. 7A and 7B are cross-sections of the resistor through planes of FIG. 6 according to an embodiment of the instant invention.

FIGS. 8A and 8B are cross-sections of the resistor through planes of FIG. 6 according to an embodiment of the instant invention.

FIG. 9 is a cross-section of the completed resistor through a plane in FIG. 6 according to an embodiment of the instant invention.

FIG. 10 is a circuit element diagram of an embodiment of the instant invention.

DETAILED DESCRIPTION OF THE INVENTION

FIGS. 1 through 8 illustrates various aspects of an electronic device and the method of forming a self aligned source resistor in embedded FLASH applications.

Figure 1:
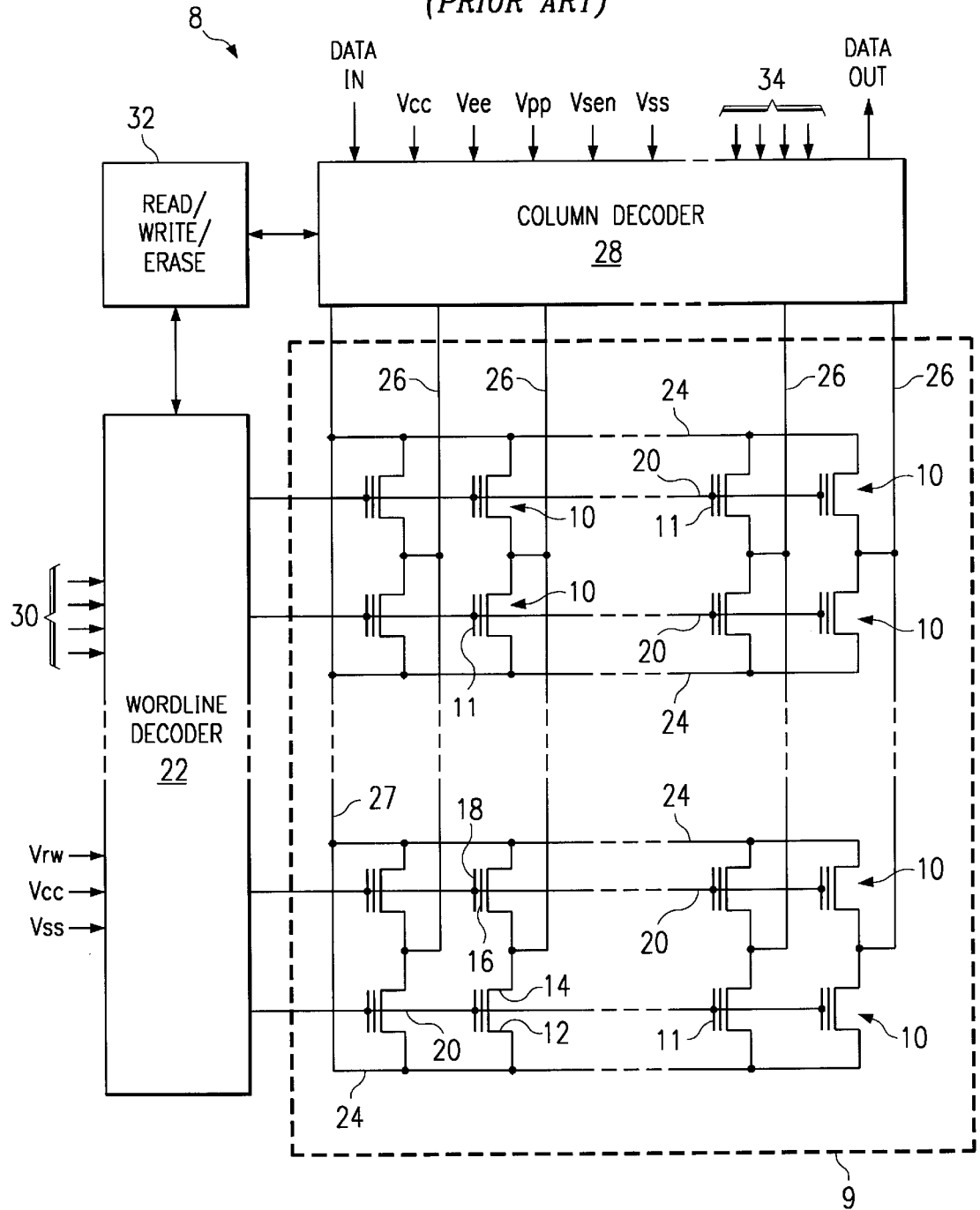
FIG. 1 is an electrical schematic diagram, in partial block diagram form, of an electronic device which includes a memory cell array in accordance with the prior art.

FIG. 1 is an electrical schematic diagram, in partial block form, of an electronic device 8 in accordance with the prior art. The electronic device 8 includes a wordline decoder 22, a column decoder 28, a Read/Write/Erase control circuit 32 for controlling the decoders 22 and 28, and a memory cell array 9. The memory cell array 9 comprises a number of memory cells 10 arranged in rows and columns. Each memory cell 10 includes a floating-gate transistor 11 having a source 12, a drain 14, a floating gate 16, and a control gate 18.

Each of the control gates 18 in a row of cells 10 is coupled to a wordline 20, and each of the wordlines 20 is coupled to the wordline decoder 22. Each of the sources 12 in a row of cells 10 is coupled to a source line 24. Each of the drains 14 in a column of cells 10 is coupled to a drain-column line 26. Each of the source lines 24 is coupled by a column line 27 to the column decoder 28 and each of the drain-column lines 26 is coupled to the column decoder 28.

In a write or program mode, the wordline decoder 22 may function, in response to wordline address signals on lines 30 and to signals from the Read/Write/Erase control circuit 32 to place a preselected first programming voltage $V_{RW}$, approximately +12V, on a selected wordline 20, which is coupled to the control gate 18 of a selected cell 10. Column decoder 28 also functions to place a second programming voltage $V_{PP}$, approximately +5 to +10V, on a selected drain-column line 26 and, therefore, the drain 14 of the selected cell 10. Source lines 24 are coupled to a reference potential $V_{SS}$ through line 27. All of the deselected drain-column lines 26 are coupled to the reference potential $V_{SS}$. These programming voltages create a high current (drain 14 to source 12) condition in the channel of the selected memory cell 10, resulting in the generation near the drain-channel junction of channel-hot electrons and avalanche breakdown electrons that are injected across the gate oxide to the floating gate 16 of the selected cell 10. The programming time is selected to be sufficiently long to program the floating gate 16 with a negative program charge of approximately −2V to −6V with respect to the gate region.

The floating gate 16 of the selected cell 10 is charged with channel-hot electrons during programming, and the electrons in turn render the source-drain path under the floating gate 16 of the selected cell 10 nonconductive, a state which is read as a "zero" bit. Deselected cells 10 have source-drain paths under the floating gate 16 that remain conductive, and those cells 10 are read as "one" bits.

In a flash erase mode, the column decoder 28 functions to leave all drain-column lines 26 floating. The wordline decoder 22 functions to connect all of the word lines 20 to the reference potential $V_{SS}$. The column decoder 28 also functions to apply a high positive voltage $V_{EE}$, approximately +10V to +15V, to all of the source lines 24. These erasing voltages create sufficient field strength across the tunneling area between floating gate 16 and the semiconductor substrate to generate a Fowler-Nordheim tunnel current that transfers charge from the floating gate 16, thereby erasing the memory cell 10.

In the read mode, the wordline decoder 22 functions, in response to wordline address signals on lines 30 and to signals from Read/Write/Erase control circuit 32, to apply a preselected positive voltage $V_{CC}$, approximately +5V, to the selected wordline 20, and to apply a low voltage, ground or $V_{SS}$, to deselected wordlines 20. The column decoder 28 functions to apply a preselected positive voltage $V_{SEN}$, approximately +1.0V, to at least the selected drain column line 28 and to apply a low voltage to the source line 24. The column decoder 28 also functions, in response to a signal on an address line 34, to connect the selected drain-column line 26 of the selected cell 10 to the DATA OUT terminal. The conductive or non-conductive state of the cell 10 coupled to the selected drain-column line 26 and the selected wordline 20 is detected by a sense amplifier (not shown) coupled to the DATA OUT terminal. The read voltages applied to the memory array 9 are sufficient to determine channel impedance for a selected cell 10 but are insufficient to create either hot-carrier injection or Fowler-Nordheim tunneling that would disturb the charge condition of any floating gate 16.

For convenience, a table of read, write and erase voltages is given in TABLE 1 below:

TABLE 1

|  | Read | Write | Flash Erase |
|---|---|---|---|
| Selected Wordline | 5 V | 12 V | 0 V (All) |
| Deselected Word lines | 0 V | 0 V | — |
| Selected Drain Line | 1.0 V | 5–10 V | Float (All) |
| Deselected Drain Lines | Float | 0 V | — |
| Source lines | 0 V | About 0 V | 10–15 V (All) |

Figure 2:
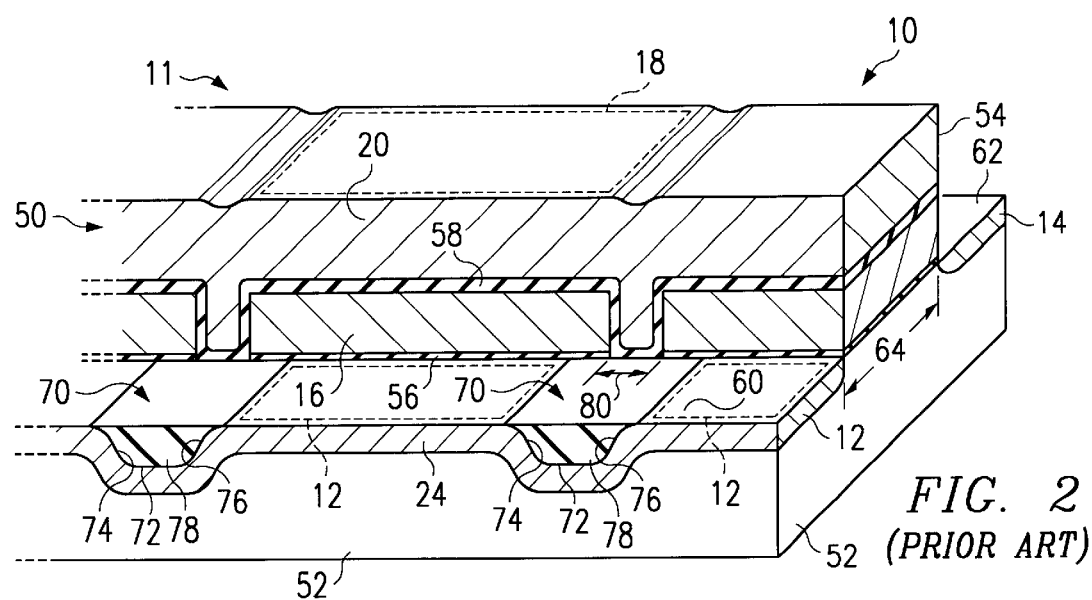
FIG. 2 is a perspective view of a portion of the memory cell array of FIG. 1.
Figure 3:
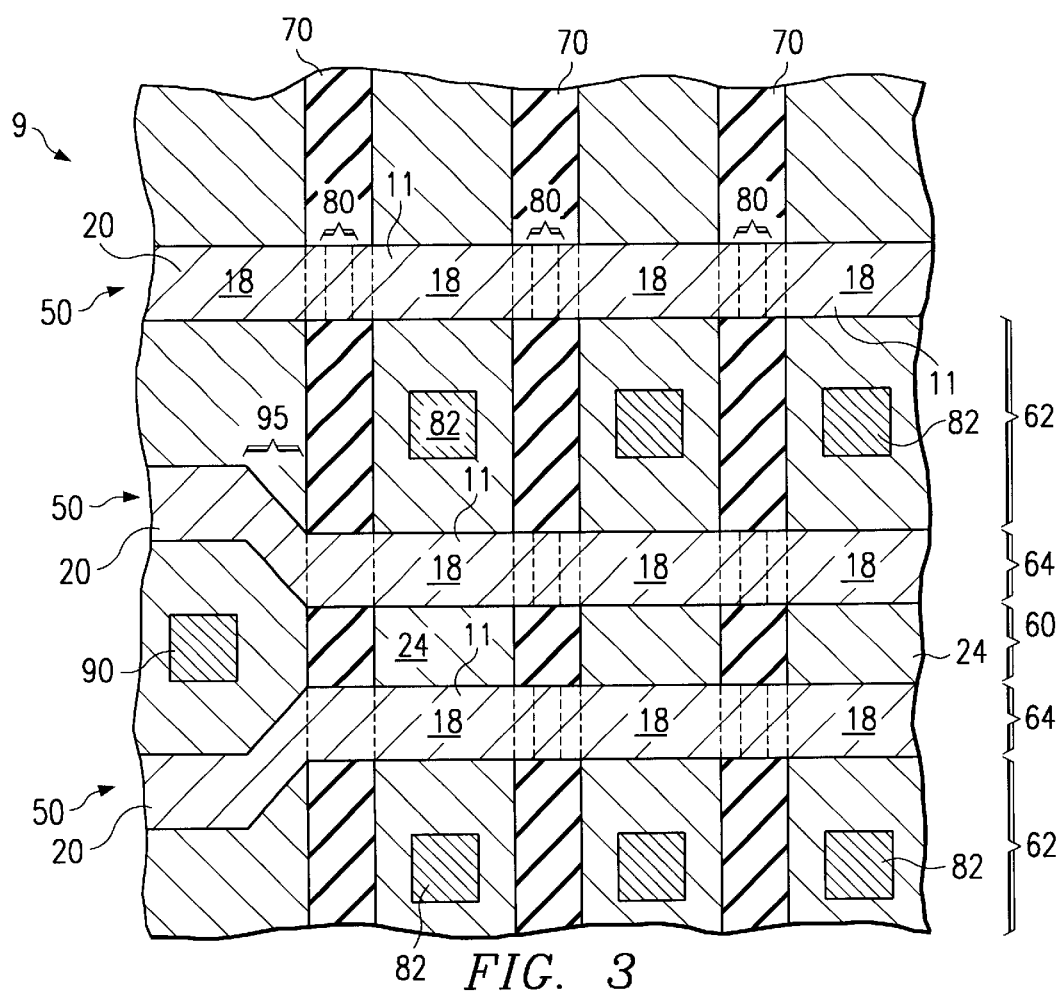
FIG. 3 is an enlarged plan view of a portion of the memory cell of FIG. 1.

FIGS. 2 and 3 illustrate the structure of a portion of the memory array 9 illustrated in FIG. 1. Specifically, FIG. 2 is a perspective view of a portion of the memory array 9 and FIG. 3 is an enlarged plan view of a portion of memory array 9. As discussed previously, the memory array 9 includes a number of memory cells 10 arranged in rows and columns.

As best illustrated in FIG. 2, each row of memory cells 10 is formed from a continuous stack structure 50 that includes a number of memory cells 10. The floating gate transistor 11 within each memory cell 10 is formed on a semiconductor substrate 52 and separated from each adjacent memory cell 10 in the continuous stack structure 50 by a shallow trench isolation structure 70. The semiconductor substrate 52 includes a source region 60 and a drain region 62 separated by a channel region 64. The floating gate transistor 11 is generally fabricated by forming a gate stack 54 outwardly from a portion of the channel region 64 and doping a portion of the source region 60 and a portion of the drain region 62 adjacent the gate stack 54 to form a source 12 and a drain 14, respectively.

The semiconductor substrate 52 may comprise a wafer formed from a single-crystalline silicon material. The semiconductor substrate 52 may include an epitaxial layer, a recrystallized semiconductor material, a polycrystalline semiconductor material, or any other suitable semiconductor material.

The regions 60, 62, and 64 are substantially parallel and may extend the length of the memory array 9. The channel region 64 of the semiconductor substrate 52 is doped with impurities to form a semiconductive region. The channel region 64 of the semiconductor substrate 12 may be doped with p-type or n-type impurities to change the operating characteristics of a microelectronic device (not shown) formed on the doped semiconductor substrate 52.

As best illustrated in FIG. 2, the floating gate transistors 11 in each continuous stack structure 50 in the memory array 9 are electrically isolated from one another by the shallow trench isolation (STI) structure 70. The STI structures 70 are generally formed prior to the fabrication of the gate stack 54 on the semiconductor substrate 52. The STI structures 70 are formed by etching a trench 72 into the semiconductor substrate 52. The trench 72 is generally on the order of 0.2 to 8.5 µm in depth. The trench 72 comprises a first sidewall surface 74 and a second sidewall surface 76.

The trench 72 is then filled with a trench dielectric material 78 to electrically isolate the active regions of the semiconductor substrate 52 between the STI structures 70. The trench dielectric material 78 may comprise silicon dioxide, silicon nitride, or a combination thereof. The trench dielectric material 78 is generally etched back, followed by a deglaze process to clean the surface of the semiconductor substrate 52 prior to fabrication of the gate stack 54.

The continuous stack structure 50 is then fabricated outwardly from the semiconductor substrate 52 and the filled trench 72. The continuous stack structure 50 is formed from a series of gate stacks 54 fabricated outwardly from the channel region 64 of the semiconductor substrate 52. As best shown in FIG. 2, the gate stack 54 comprises a gate insulator 56, the floating gate 16, an interstitial dielectric 58, and the control gate 18. The gate insulator 56 is formed outwardly from the semiconductor substrate 52, and the floating gate 16 is formed outwardly from the gate insulator 56. The interstitial dielectric 58 is formed between the floating gate 16 and the control gate 18 and operates to electrically isolate the floating gate 16 from the control gate 18.

The gate insulator 56 is generally grown on the surface of the semiconductor substrate 52. The gate insulator 56 may comprise oxide or nitride on the order of 25 to 500 A in thickness.

The floating gate 16 and the control gate 18 are conductive regions. The gates 16 and 18 generally comprise a polycrystalline silicon material (polysilicon) that is in-situ doped with impurities to render the polysilicon conductive. The thicknesses of the gates 16 and 18 are generally on the order of 100 nanometers and 300 nanometers, respectively.

The interstitial dielectric 58 may comprise oxide, nitride, or a heterostructure formed by alternating layers of oxide and nitride. The interstitial dielectric 58 is on the order of 5 to 40 nanometers in thickness.

As best illustrated in FIG. 3, the control gate 18 of each floating gate transistor 11 is electrically coupled to the control gates 18 of adjacent floating gate transistors 11 within adjacent continuous stack structures 50 to form a continuous conductive path. In the context of the memory array 9 discussed with reference to FIG. 1, the continuous line of control gates 18 operate as the wordline 20 of the memory array 9.

In contrast, the floating gate 16 of each floating gate transistor 11 is not electrically coupled to the floating gate 16 of any other floating gate transistor 11. Thus, the floating gate 16 in each floating gate transistor 11 is electrically isolated from all other floating gates 16. The floating gates 16 in adjacent memory cells 10 are isolated by a gap 80. The gap 80 is generally etched into a layer of conductive material (not shown) that is used to form the floating gate 16.

As shown in FIG. 2, the source 12 and the drain 14 of the floating gate transistor 11 are formed within a portion of the source region 60 and the drain region 62 of the semiconductor substrate 52, respectively. The source 12 and the drain 14 comprise portions of the semiconductor substrate 52 into which impurities have been introduced to form a conductive region. The drains 14 of each floating gate transistor 11 in a column are electrically coupled to each other by a number of drain contacts 82 to form the drain column line 26 (not shown). The drain column line 26 is generally formed outwardly from the wordline 20. As will be discussed in greater detail below, the source 12 of each floating gate transistor 11 forms a portion of the source line 24 and is formed during the fabrication of the source line 24.

As best illustrated in FIG. 2, a portion of the source line 24 forms the source 12 of the floating gate transistor 11. The source line 24 connects the sources 12 to each other by a continuous conductive region formed within the semiconductor substrate 52 proximate the source region 60. As best illustrated in FIG. 2, the source line 24 crosses the STI structures 70 in the source region 60 of the semiconductor substrate 52 below the STI structures 70. In contrast, the STI structures 70 electrically isolate the adjacent floating gate transistors 11 in the channel region 64 of the semiconductor substrate.

The source line 24, and correspondingly the sources 12 of each floating gate transistor 11, is generally fabricated after at least a portion of the gate stack 54 has been fabricated. The gate stack 54 is pattern masked (not shown) using conventional photolithography techniques, leaving the semiconductor substrate 52, proximate the source region 60, exposed. The exposed region of the semiconductor substrate 52 is then etched to remove the trench dielectric material 78 in the exposed region. The etching process to remove the trench dielectric material 78 may be an anisotropic etching process. Anisotropic etching may be performed using a reactive ion etch (RIE) process using carbon-fluorine based gases such as $CF_4$ or $CHF_3$.

The semiconductor substrate 52 proximate the source region 60, including that portion of the semiconductor substrate 52 forming the trench 72, is doped with impurities to render the region conductive. The conductive region is then thermally treated to diffuse the impurities into the source region 60 of the semiconductor substrate 52. The diffused conductive region forms both the source 12 of each floating gate transistor 11 as well as the source line 24. The source region 60 of the semiconductor substrate 52 is generally doped by an implantation process in which dopant ions are impacted into the semiconductor substrate 52. After formation of the source line 24, and as a part of subsequent processing, the trench 72 is refilled with a dielectric material.

Shown in FIG. 3 is the source line contact 90. In typical FLASH memory layout design there is one source contact for every sixteen drain contacts. Because of the spacing of the source line the word line 20 has to bend 95 around the source contact 90. In addition for high density designs, the width of the drain region 62 is larger than the width of the source region 60. This results in a non-uniform spacing of the wordlines 20.

Figure 4:
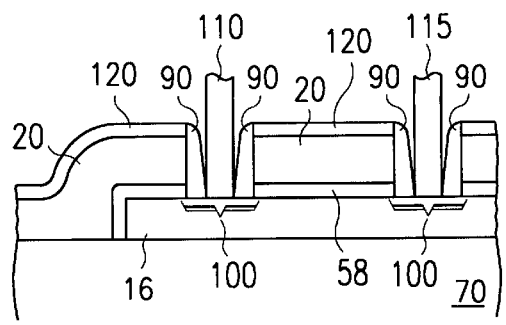
FIG. 4 is cross-sectional view of an FLASH memory cell poly-1 resistor in accordance with the prior art.

Shown in FIG. 4 is a floating gate (poly-1) resistor 112 fabricated in accordance with the prior art. This resistor may be part of an integrated circuit that contains embedded FLASH memory circuits among CMOS circuits. In this application the resistor is typically formed on large areas of the isolation oxide 70. This isolation oxide can be formed using a LOCOS or a STI process. To form the poly-1 resistor structure 112, the FLASH cell gate stack is formed as described above. The openings 100 are formed over the floating gate during the gate etch process of the CMOS circuits which occurs after floating gate stack formation. A layer of photoresist is formed on the circuit and patterned to define the CMOS gate structures and the openings over the floating gate 100. During the polysilicon etch process used to define the CMOS gate structures, the openings 100 will be formed. Sidewall nitride structures 90 are formed to isolate the contact structures 110 and 115 from the control gate 20. The contacts 110 and 115 will provide electrical contact to the poly-1 resistor structure formed using the poly-1 (floating gate) layer 16. As shown in FIG. 4, the control gate 20 and the poly-1 (floating gate) 16 are separated by the interpoly dielectric 58. As described earlier, this interpoly dielectric can comprise layers of silicon oxide and silicon nitride. During the sequence of processes used to complete the integrated circuit, a low resistivity layer of titanium, tungsten or cobalt silicide 120 will be formed on the control gate 20. This layer typically has a sheet resistivity of about 1–8 ohm/sq.

Figure 5:
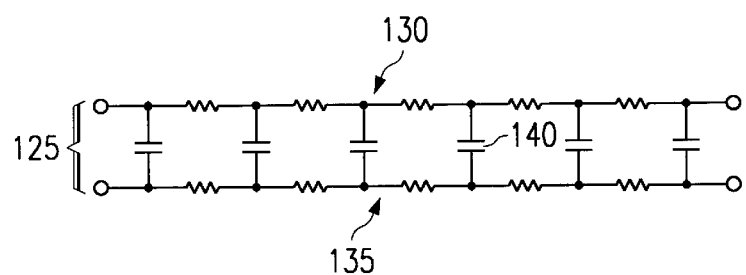
FIG. 5 is an equivalent circuit of the distributed resistor and capacitor network of the FLASH poly-1 resistor illustrated in FIG. 4.

Shown in FIG. 5 is the equivalent circuit for the poly-1 resistor structure illustrated in FIG. 4. The circuit comprises a distributed resistor capacitor network 125. The line of resistors 135 are due to the resistivity of the poly-1 (floating gate) layer 16. The line of resistors 130 are due to the presence of the control gate layer 20 and the silicide layer 120. The capacitors 140 are due to the presence of the interpoly dielectric layer 58. For high frequency applications such as wireless communications, the reactance of the capacitors 140 (which is inversely proportional to the frequency) will decrease. This will cause the low resistivity silicide layer 120 to have a larger contribution to the overall resistance of the structure resulting in a decrease in the resistance between contacts 100 and 115. This decrease in resistance makes the structure of FIG. 4 unsuitable for high frequency applications.

Figure 6:
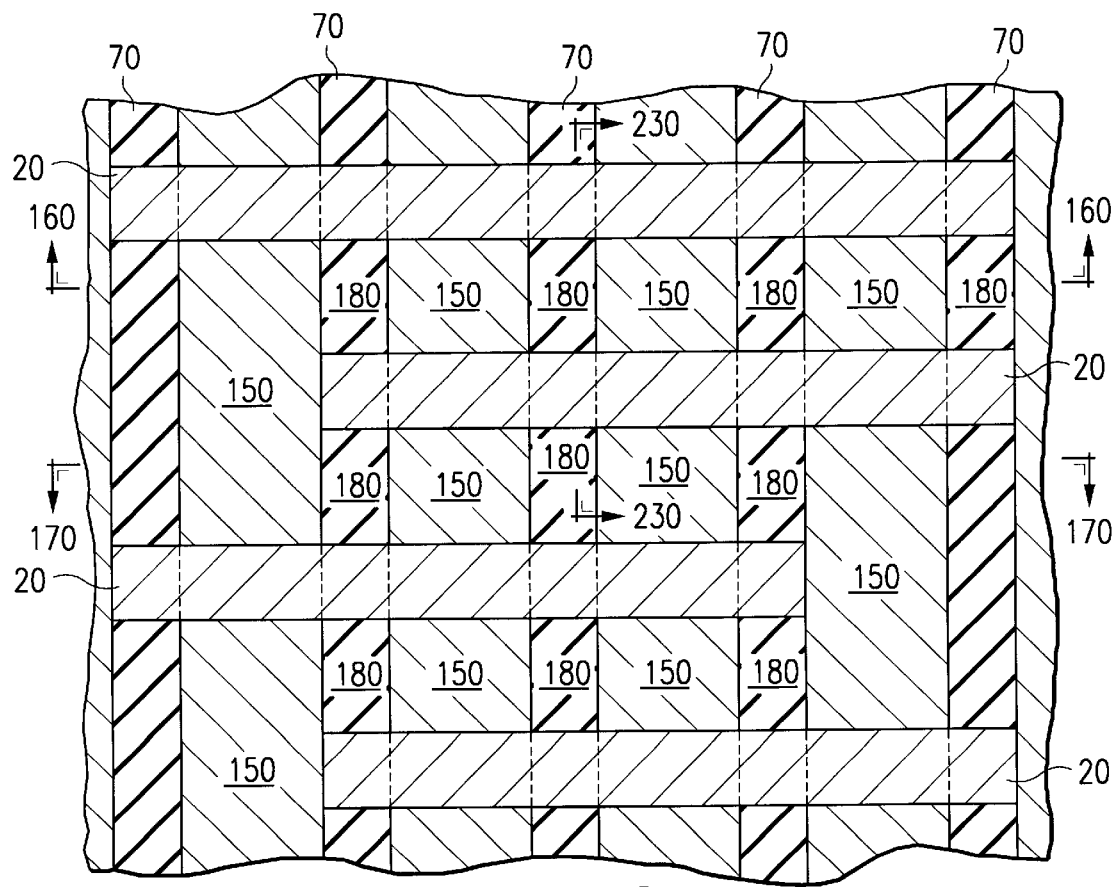
FIG. 6 is a perspective view of a portion of the resistor according to an embodiment of the instant invention.

Shown in FIG. 6, is an embodiment for a layout of a self aligned source (SAS) resistor according to the instant invention. The isolation regions 70 comprise dielectric material as described earlier. The word lines 20 are polysilicon lines as described earlier. The SAS resistor shown in FIG. 6 can be fabricated in either an n-type region or a p-type region in the semiconductor substrate 52. The SAS resistor shown in FIG. 6 is fabricated simultaneously with the FLASH memory cell using identical processes. These processes include, the floating gate 16, the gate insulator 56, the control gate 18, the word line 20, the isolation regions 70, and the source and drain regions 12 and 14 respectively. The implanted regions in FIG. 6 formed during the source and drain implants are denoted as 150. If the SAS resistor is fabricated in a p-type region then a n-type species will be implanted to form 150. In an embodiment, the n-type species can be selected from the group of P, As, Sb and Bi either singly or in combination. If the SAS resistor is fabricated in a n-type region then a p-type species will be implanted to form 150. In an embodiment, the p-type species can be selected from the group of B, Ga, BF2, and In either singly or in combination. If the SAS resistor is fabricated in a n-type region, then the source 12 and drain 14 region implants will not be used. In this embodiment the implant used to form the source and drain regions for the PMOS transistor can be used to form 150. In the embodiment where the SAS resistor is fabricated in an p-type region of the semiconductor substrate 52, the process sequence for the formation of the FLASH memory circuit and the SAS resistor circuit is identical up to the self aligned source etch process described earlier for the FLASH memory circuit. In the FLASH memory circuit a photoresist film is patterned and a continuous source line formed by removing the necessary isolation regions 70. In the fabrication of the SAS resistor, the entire resistor circuit is exposed to the SAS etch process. The SAS etch process is an oxide etch and will remove the isolation oxide 70 from all the trench regions not covered or protected by the word lines. This is shown in FIGS. 7A and 7B which shows the cross-sections through 160 and 170 in FIG. 6. During the subsequent SAS implant process which introduces n-type dopants to form the source line 24 in the FLASH memory cell, resistor regions 180 illustrated in FIGS. 8A and 8B are formed. FIGS. 8A and 8B are cross sections taken through 160 and 170 in FIG. 6. The implanted regions 150 and 180 now form a continuous doped diffusion region that will form the SAS resistor. As shown in FIG. 6, regions 150 and 180 form a serpentine structure that can be electrically contacted at various points determined by the required resistor value. Since the physical value of the resistor is proportion to its length, larger values of resistor will require that the electrical contacts to the serpentine structure be placed further apart. Electrical contacts to the SAS resistor can be formed in any number of ways currently used in the art. The serpentine layout shown in FIG. 6 is an embodiment of the instant invention. The instant invention in not however to be limited to this structure. In other embodiments of the instant invention different shapes or arrangements of the resistor can be used.

Shown in FIG. 9 is the cross-section through 230 in FIG. 6 for the completed SAS resistor structure. The dielectric film 190 is formed as a part of the sidewall formation process for the FLASH and CMOS circuits. The dielectric film 190 can be a material selected form the group consisting of silicon nitride, silicon oxide, silicon oxynitride, or any suitable dielectric material. The post sidewall etch film 190 will fillup the SAS resistor blocking the formation of a silicide film. This allows the elimination of a masking step. The dielectric film 200 will be formed as a part of the plaranization process before formation of the metal layers of the integrated circuit. In an embodiment of the instant invention, the layer 200 is a polysilicon/Metall dielectric (PMD). This PMD layer 200 may comprise doped silicon oxide where the dopant maybe phosphorous (phosphosilicate glass) or both phosphorous and boron (borophosphosilicate) glass. Both layers 190 and 200 are usually formed using a chemical vapor deposition process.

Another embodiment of the instant invention is shown in FIG. 10. A FLASH memory circuit as shown in FIG. 2 uses a SAS process to form a continuous source line 60. As described earlier, this continuous source line 60 comprises the source regions of the various memory cells 12 linked by an implanted region 24 formed after removing selected portions of the isolation regions 70. This continuous source line will have some resistance associated with it and can be represented by a lumped resistor element 240 in FIG. 10. The ends of the lumped resistor element in FIG. 10, 242 and 244 represent first and second terminals on the continuous source line. These terminals are points along the continuous source line where electrical connection is made to the source line 60. By connecting the continuous source line to an external circuit element 250 through these terminals as shown in FIG. 10, the continuous source line will form a discrete semiconductor resistor element. It should be noted that the external circuit element 250 can be outside of the memory array. In embedded FLASH applications this external circuit element can be a part of the CMOS portion of the integrated circuit. The connection of the continuous source line 60 to an external circuit element 250 can be performed in any number of ways currently used in the art.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. A method for forming a resistor in a semiconductor substrate comprising:
   providing a region of a first conductivity type in said semiconductor substrate;
   providing on said region of a first conductivity type, a plurality of substantially parallel wordlines that cross a plurality of substantially parallel isolation regions, said isolation regions containing an isolation material;
   implanting said region of a first conductivity type in said semiconductor substrate containing said plurality of substantially parallel wordlines and said plurality of substantially parallel isolation regions with a first species;
   etching said isolation material from all regions of said plurality of substantially parallel isolation regions not covered by said plurality of substantially parallel wordlines; and
   implanting said region of a first conductivity type in said semiconductor substrate containing said plurality of substantially parallel wordlines and said plurality of substantially parallel isolation regions with said first species to form a resistor.

2. The method of claim 1 wherein said first conductivity type is p-type.

3. The method of claim 2 wherein said first species is selected from the group consisting of P, As, Sb and Bi.

4. The method of claim 1 wherein said first conductivity type is n-type.

5. The method of claim 4 wherein said first species is selected from the consisting of B, Ga, $BF_2$, and In.

* * * * *

UNITED STATES PATENT AND TRADEMARK OFFICE
CERTIFICATE OF CORRECTION

PATENT NO.    : 6,348,370 B1
DATED         : February 19, 2002
INVENTOR(S)   : Freidoon Mehrad, Harold D. Goodpaster and Anand Seshadri It is certified that error appears in the above-identified patent and that said Letters Patent is hereby corrected as shown below:

<u>Title page,</u>
After Related U.S. Application Data, please insert the following:
-- Provisional application No. 60/145,766 July 27, 1999 --

Signed and Sealed this

Thirtieth Day of July, 2002

*Attest:*

*Attesting Officer*

JAMES E. ROGAN
*Director of the United States Patent and Trademark Office*